US008427834B2

(12) United States Patent
Gerken et al.

(10) Patent No.: US 8,427,834 B2
(45) Date of Patent: Apr. 23, 2013

(54) ROTATABLE LATCH FOR COMPRESSING THERMAL INTERFACE MATERIAL BETWEEN A HEAT GENERATING ELECTRICAL COMPONENT AND A COOLING ELECTRICAL COMPONENT

(75) Inventors: James D. Gerken, Zumbro Falls, MN (US); Christopher M. Marroquin, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 296 days.

(21) Appl. No.: 12/979,808

(22) Filed: Dec. 28, 2010

(65) Prior Publication Data
US 2012/0162920 A1 Jun. 28, 2012

(51) Int. Cl.
*H05K 7/20* (2006.01)
(52) U.S. Cl.
USPC ........... 361/707; 361/688; 361/704; 165/80.2
(58) Field of Classification Search .................. None
See application file for complete search history.

(56) References Cited

U.S. PATENT DOCUMENTS

| | | | |
|---|---|---|---|
| 4,821,147 | A | 4/1989 | Jacobs et al. |
| 4,825,337 | A | 4/1989 | Karpman |
| 5,953,211 | A | 9/1999 | Donahoe et al. |
| 6,061,239 | A | 5/2000 | Blomquist |
| 6,665,184 | B2 | 12/2003 | Akselband |
| 6,816,376 | B2 * | 11/2004 | Bright et al. ................... 361/704 |
| 6,882,533 | B2 | 4/2005 | Bash et al. |
| 7,083,444 | B1 | 8/2006 | Barina et al. |
| 7,322,850 | B2 * | 1/2008 | Neer et al. ...................... 439/567 |
| 7,405,931 | B2 * | 7/2008 | Saturley et al. ........... 361/679.48 |
| 7,408,782 | B2 | 8/2008 | Austin et al. |
| 7,529,094 | B2 * | 5/2009 | Miller .......................... 361/715 |
| 7,539,018 | B2 * | 5/2009 | Murr et al. .................... 361/704 |
| 7,621,773 | B2 * | 11/2009 | Bright et al. ................... 439/490 |
| 8,134,834 | B2 * | 3/2012 | Meyer et al. ................... 361/700 |
| 2009/0004902 | A1 | 1/2009 | Pandey et al. |

OTHER PUBLICATIONS

Bivar Inc., "Insertor/extractors," Bivar Electronic Assembly Hardware, Bivar Inc., Irvine, CA, 1990, p. 11.

* cited by examiner

*Primary Examiner* — Boris Chervinsky
(74) *Attorney, Agent, or Firm* — H. Barrett Spraggins; Cynthia G. Seal; Biggers & Ohanian, LLP.

(57) ABSTRACT

Apparatuses are provided for compressing a thermal interface material between a heat generating electrical component and a cooling electrical component. Embodiments include a draw rod coupled at one end to the cooling electrical component, the draw rod passing through the heat generating electrical component; wherein the draw rod includes a pin on the end opposite the end coupled to the cooling electrical component; and a rotatable latch coupled to the heat generating electrical component, the rotatable latch including a hook at one end; wherein when the rotatable latch is in an engaged position, the hook of the rotatable latch engages the pin of the draw rod such that the thermal interface material adhered to the heat generating component is coupled to the cooling electrical component; wherein when the rotatable latch is in an unengaged position, the hook of the rotatable latch is not engaged with the pin of the draw rod.

20 Claims, 7 Drawing Sheets

ROTATABLE LATCH FOR COMPRESSING THERMAL INTERFACE MATERIAL BETWEEN A HEAT GENERATING ELECTRICAL COMPONENT AND A COOLING ELECTRICAL COMPONENT

BACKGROUND OF THE INVENTION

1. Field of the Invention

The field of the invention is data processing, or, more specifically, apparatuses that include a rotatable latch for compressing a thermal interface material between a heat generating electronic component and a cooling electrical component.

2. Description of Related Art

Heat generating electrical components typically include a heat spreader designed to transfer heat to a cooling rack of a cooling electrical component. To aid in the transfer of the heat, a thermal interface material may be placed between the heat spreader of the heat generating electrical component and the cooling rack of the cooling electrical component. Compression of the thermal interface material impacts the heat transfer between the heat spreader and the cooling rack.

SUMMARY OF THE INVENTION

Apparatuses are provided for compressing a thermal interface material between a heat generating electrical component and a cooling electrical component. Embodiments include a draw rod coupled at one end to the cooling electrical component, the draw rod passing through the heat generating electrical component; wherein the draw rod includes a pin on the end opposite the end coupled to the cooling electrical component; and a rotatable latch coupled to the heat generating electrical component, the rotatable latch including a hook at one end; wherein when the rotatable latch is in an engaged position, the hook of the rotatable latch engages the pin of the draw rod such that the thermal interface material adhered to the heat generating component is coupled to the cooling electrical component; wherein when the rotatable latch is in an unengaged position, the hook of the rotatable latch is not engaged with the pin of the draw rod.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
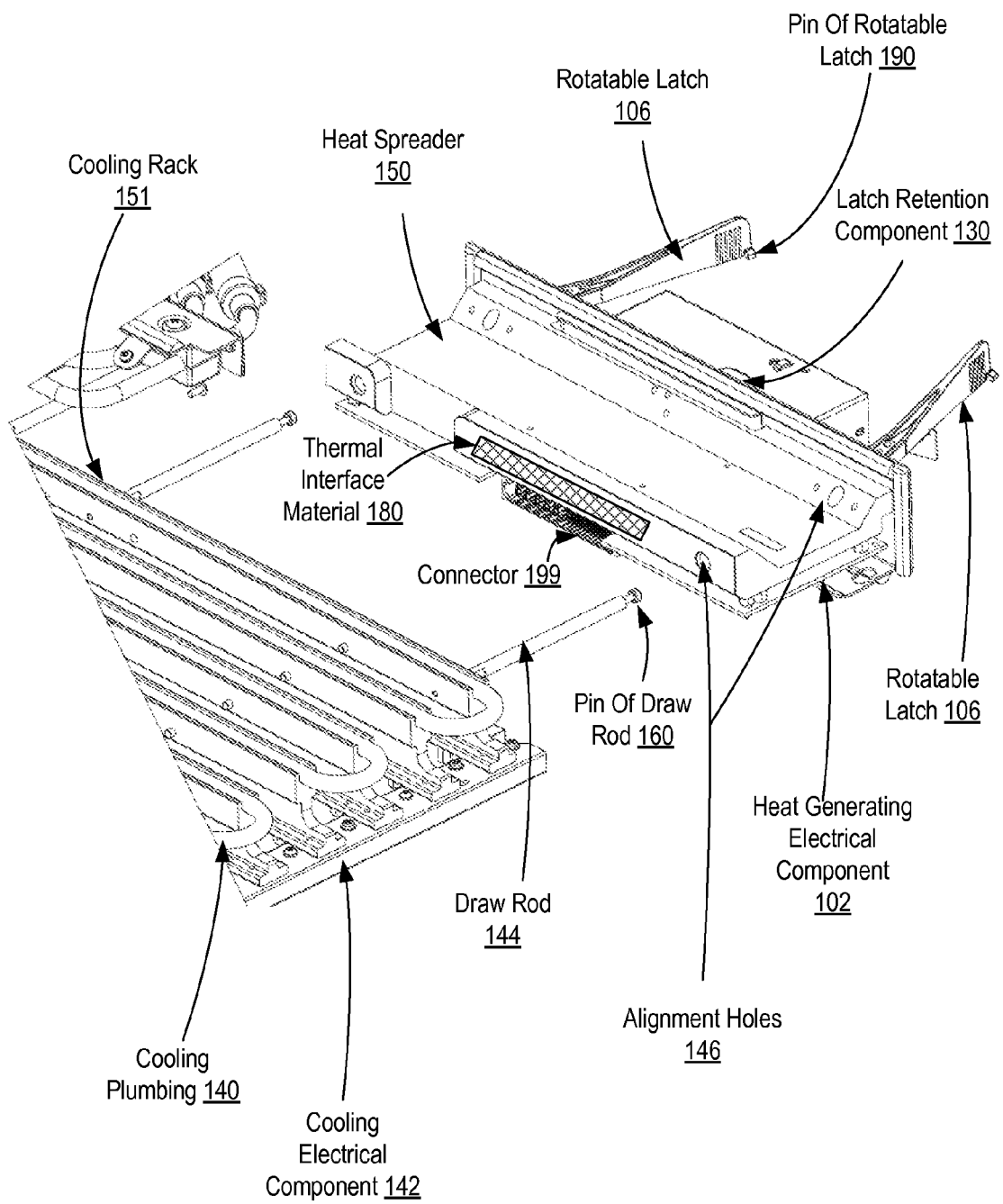
FIG. 1 sets forth a diagram of an example of an apparatus that includes a rotatable latch for compressing thermal interface material between a heat generating electrical component and a cooling electrical component in accordance with the present invention.

Examples of apparatuses that include a rotatable latch for compressing a thermal interface material between a heat generating electrical component and a cooling electrical component in accordance with the present invention are described with reference to the accompanying drawings, beginning with FIG. 1. FIG. 1 sets forth a diagram of an example of an apparatus that includes a rotatable latch (106) for compressing a thermal interface material (180) between a heat generating electrical component (102) and a cooling electrical component (142) in accordance with the present invention. The heat generating electrical component (102) includes a heat spreader (150) for transferring heat to a cooling rack (151) of the cooling electrical component (142). The cooling electrical component (142) of FIG. 1 includes cooling plumbing (140) for cooling the cooling rack (151). Cooling plumbing includes pipes for transporting cooled liquid. A cooling rack is a raised plate that is cooled by cooling plumbing.

A heat generating electrical component may be a power supply card or any other type of electrical device that generates heat. A heat spreader is a piece of material that extends from the heat generating electrical component (102) and provides a surface to transfer heat. To aid in the transfer of heat, the thermal interface material (180) of FIG. 1 may be adhered to the bottom of the heat spreader (150). A thermal interface material (TIM) is used to fill the gaps between thermal transfer surfaces, such as the cooling rack (151) and the heat spreader (150), in order to increase thermal transfer efficiency. The thermal interface material (180) of FIG. 1 may be thermal grease, such as silicone oil and aluminum oxide, zinc oxide, or boron nitride. The thermal interface material may also be a gap pad or a gap filler thermal interface material or similar material.

The apparatus of FIG. 1 includes a draw rod (144) that is coupled at one end of the draw rod (144) to the cooling electrical component (142). A draw rod may be made of a rigid material such as stainless steel. The draw rod (144) of FIG. 1 includes a pin (160) on the end opposite the end coupled to the cooling electrical component (142). The heat spreader (150) of FIG. 1 includes alignment holes (146) for the draw rod (144) to pass through the heat spreader (150). The draw rod (144) of FIG. 1 acts as a guidance feature to ensure that a connector (199) of the heat generating electrical component (102) is aligned with a connector (not shown) of the cooling electrical component (142). Since the draw rod (144) is located symmetric about the thermal interface material (180), there is no twisting experienced when a force is applied by the rotatable latch (106).

The apparatus of FIG. 1 also includes a rotatable latch (106) that is coupled to the heat generating electrical component (102). The rotatable latch (106) of FIG. 1 is used for coupling the heat generating electrical component (102) to the cooling electrical component (142) and for compressing the thermal interface material (180). In the example of FIG. 1, the heat generating electrical component (102) is separated from the cooling electrical component (142) and the rotatable latch (106) is in an unengaged position. However, when the heat generating electrical component (102) is placed in contact with the cooling electrical component (142) such that the draw rod (144) passes through the alignment holes (146) of the heat spreader (150), the rotatable latch (106) may be rotated from the unengaged position to an engaged position. When the rotatable latch (106) is in the unengaged position, the rotatable latch (106) may be used as a handle to separate the heat generating electrical component (102) from the cooling electrical component (142). The rotatable latch (106) may be made of a flexible material such as glass filled, injected molded plastic, which allows the rotatable latch (106) to elastically deform. The rotatable latch (106) may act as a spring to create a constant force between the heat generating electrical component (102) and the cooling electrical component (142).

When the rotatable latch (106) is in the engaged position, a hook (not shown) of the rotatable latch (106) engages the pin (160) of the draw rod (160), such that the heat generating electrical component (102) is coupled to the cooling electrical component (142). In the engaged position, the thermal interface material (180) makes contact with the cooling rack (151) but is not compressed. From the engaged position, the rotatable latch (106) may be further rotated into a locked state. When the rotatable latch (106) is in the locked state, a pin (190) of the rotatable latch (106) engages a latch retention component (130). The latch retention component (130) holds the rotatable latch (106) in the locked state. In the locked state, there is no gap between the heat spreader (150) and the cooling rack (151) and the thermal interface material (180) is compressed.

In an alternative embodiment, the rotatable latch (106) may be altered to enable a threaded nut to create compression force. In this embodiment, the pin (160) of the draw rod (144) may be replaced with a male thread. After the heat generating electrical component (102) is inserted into the cooling electrical component (142), the male thread of the draw rod (144) passes through the heat generating electrical component such that a nut may be threaded onto the male thread. As the nut is tightened, the nut would directly apply a clamping force to the thermal interface material (180) between the heat spreader (150) and the cooling rack (151).

In an additional alternative embodiment, the rotatable latch (106) may rotate about a center point such that the draw rod passes through an enlarged hole in the rotatable latch (106). As the rotatable latch (106) is rotated, the pin (160) of the draw rod slides across a ramped surface on the rotatable latch (106), which creates a smooth increase in force on the thermal interface material (180).

Figure 2:
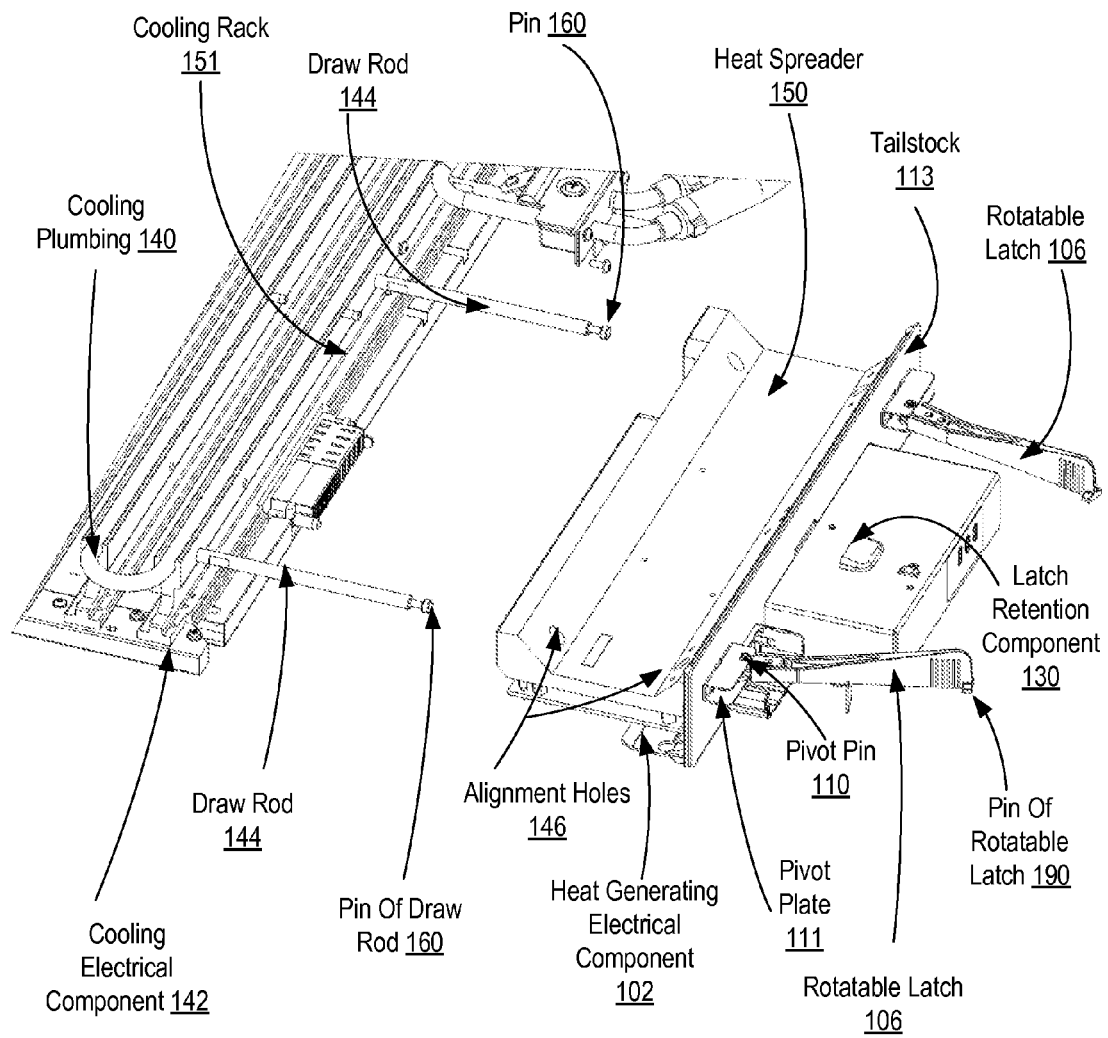
FIG. 2 sets forth a diagram of an alternative view of the apparatus of FIG. 1 that includes a rotatable latch for compressing thermal interface material between a heat generating electrical component and a cooling electrical component in accordance with the present invention.

For further explanation, FIG. 2 sets forth a diagram of an alternative view of the apparatus of FIG. 1 that includes a rotatable latch (106) for compressing thermal interface material (180) between a heat generating electrical component (102) and a cooling electrical component (142). That is, the apparatus of FIG. 2 includes the following elements of the apparatus of FIG. 1: the cooling electrical component (142), the cooling plumbing (140), the cooling rack (151), the draw rod (144), the heat generating electrical component (102), the rotatable latch (106), the heat spreader (150), and the latch retention component (130).

In the example of FIG. 2, however, the apparatus includes a pivot plate (111) and a pivot pin (110). The pivot plate (111) couples the rotatable latch (106) to a tailstock (113), which is coupled to the heat generating electrical component (102). The pivot pin (110) acts as the pivot point upon which the rotatable latch (106) rotates from the unengaged position to the engaged position to the locked state. The pivot plate (111) acts to directly resolve the force of the rotatable latch (106) on the heat generating electrical component (102) and the cooling electrical component (142) by inserting a rigid connection between the cooling rack (151) and the pivot pin (110). In this case, there is no need to further strengthen stiffener pieces, which saves cost and design complexity.

Figure 3:
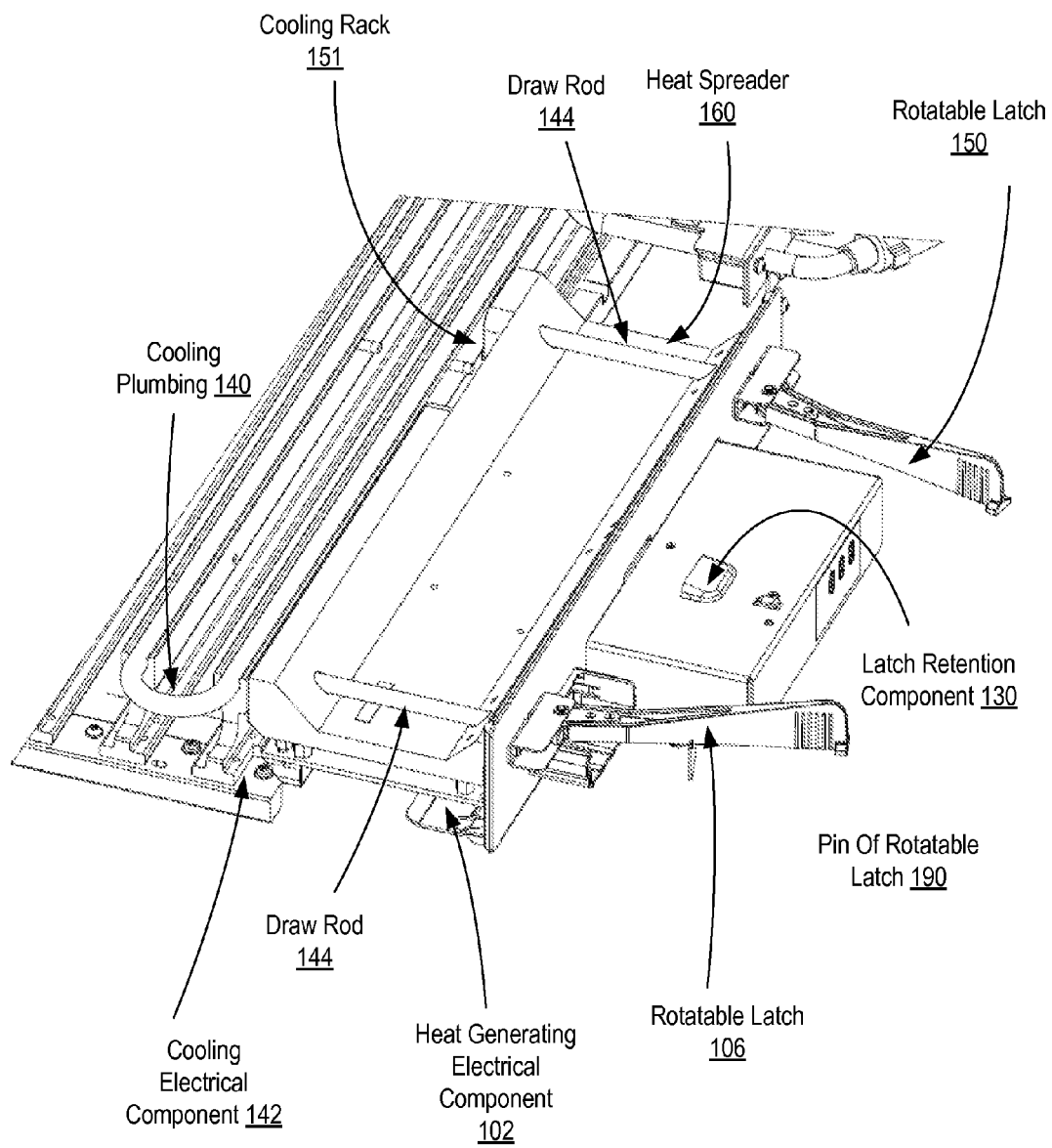
FIG. 3 sets forth a diagram of another example of an apparatus that includes a rotatable latch for compressing thermal interface material between a heat generating electrical component and a cooling electrical component in accordance with the present invention.

For further explanation, FIG. 3 sets forth a diagram of another example of an apparatus that includes a rotatable latch (106) for compressing thermal interface material (180) between a heat generating electrical component (102) and a cooling electrical component (142) in accordance with the present invention. The apparatus of FIG. 3 includes the following elements of the apparatus of FIG. 1: the cooling electrical component (142), the cooling plumbing (140), the cooling rack (151), the draw rod (144), the heat generating electrical component (102), the rotatable latch (106), the heat spreader (150), and the latch retention component (130).

In the example of FIG. 3, however, the draw rod (144) is inserted into the heat spreader (150) such that the heat generating electrical component (102) is in contact with the cooling electrical component (142). The rotatable latch (106) of FIG. 3 is in the unengaged position because the hook (not shown) of the rotatable latch (106) is not engaging the pin (160) of the draw rod (144). When the rotatable latch (106) is in the unengaged position, the rotatable latch (106) is not coupling the heat generating electrical component (102) to the cooling electrical component (142) and the thermal interface material (180) is not compressed.

Figure 4:
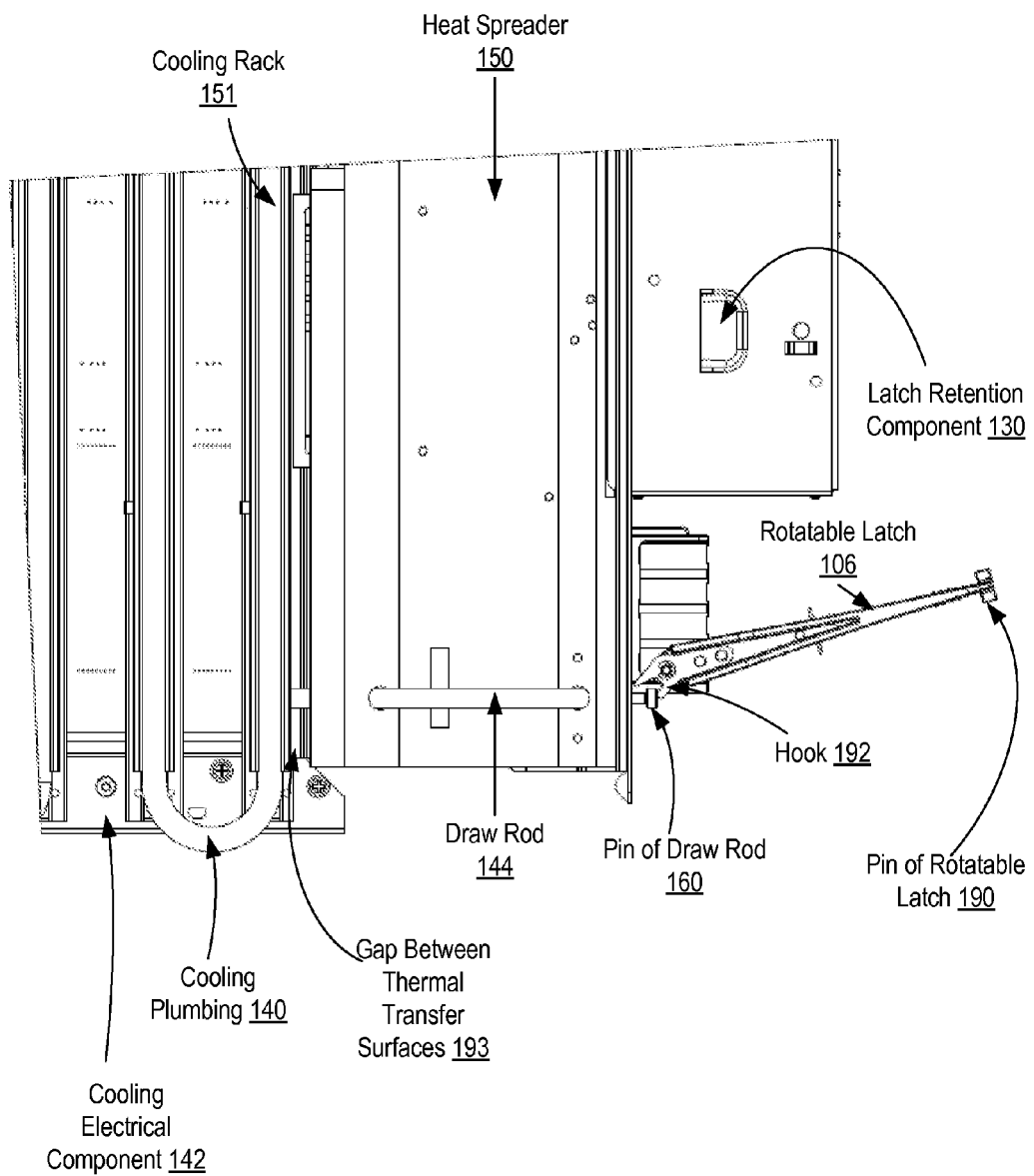
FIG. 4 sets forth a diagram of an alternative view of the apparatus of FIG. 3 that includes a rotatable latch for compressing thermal interface material between a heat generating electrical component and a cooling electrical component in accordance with the present invention.

For further explanation, FIG. 4 sets forth a diagram of an alternative view of the apparatus of FIG. 3 that includes a rotatable latch (106) for compressing thermal interface material (180) between a heat generating electrical component (102) and a cooling electrical component (142) in accordance with the present invention. The apparatus of FIG. 3 includes the following elements of the apparatus of FIG. 3: the cooling electrical component (142), the cooling plumbing (140), the cooling rack (151), the draw rod (144), the heat generating electrical component (102), the rotatable latch (106), the heat spreader (150), and the latch retention component (130).

In the example of FIG. 4, however, a hook (192) of the rotatable latch (190) is illustrated along with a gap (193) between the heat spreader (150) and the cooling rack (151). When the rotatable latch (106) is in the unengaged position, as in FIG. 4, the hook (192) of the rotatable latch (106) is not engaging the pin (160) of the draw rod (144). If the hook (192) is not engaging the pin (160) of the draw rod (144), the gap (193) between the cooling rack (151) and the heat spreader (150) prevents the thermal interface material (180) from being compressed.

Figure 5:
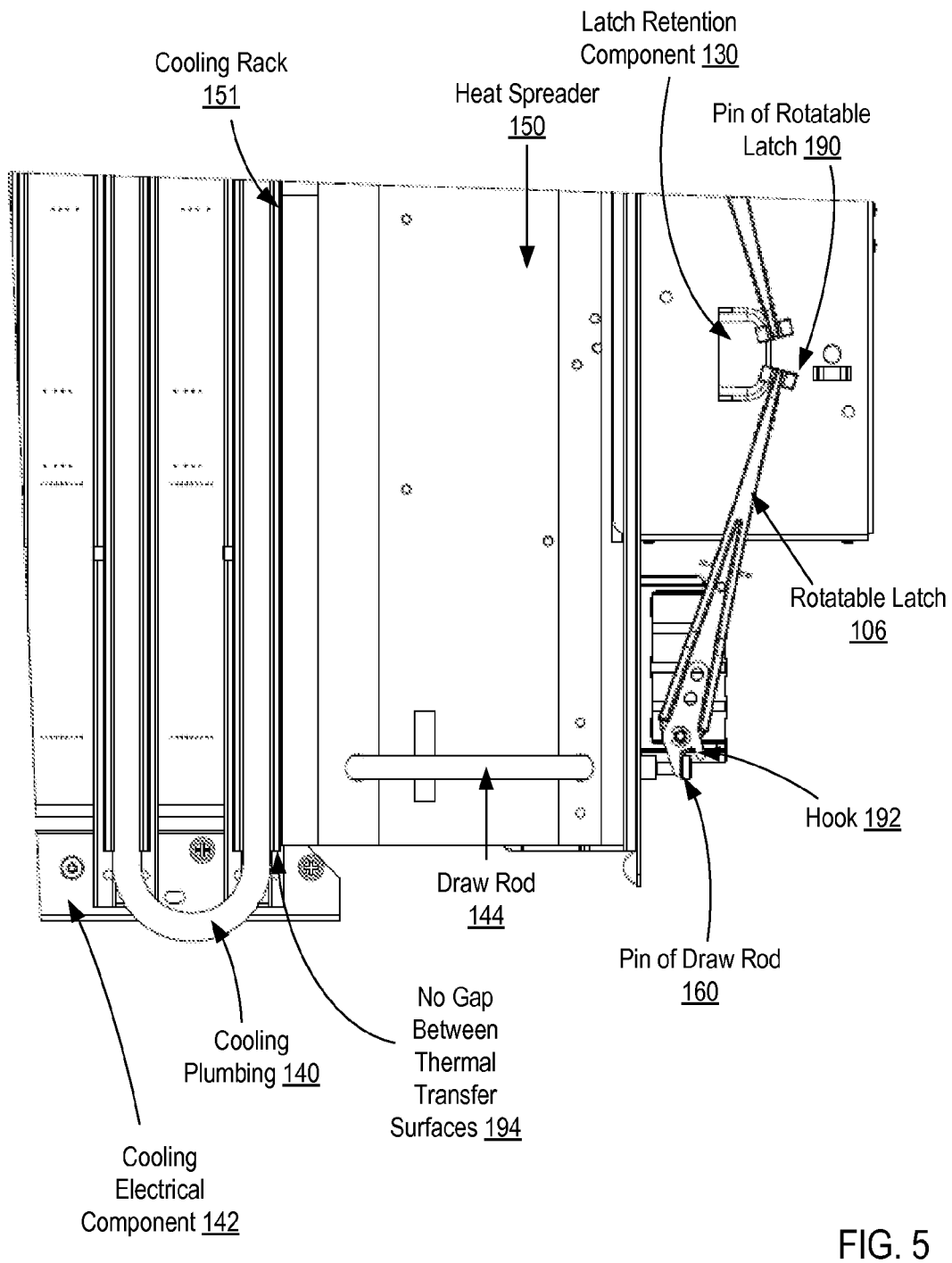
FIG. 5 sets forth a diagram of another example of an apparatus that includes a rotatable latch for compressing thermal interface material between a heat generating electrical component and a cooling electrical component in accordance with the present invention.

For further explanation, FIG. 5 sets forth a diagram of another example of an apparatus that includes a rotatable latch (106) for compressing thermal interface material (180) between a heat generating electrical component (102) and a cooling electrical component (142) in accordance with the present invention. The apparatus of FIG. 5 includes the following elements of the apparatus of FIG. 1: the cooling electrical component (142), the cooling plumbing (140), the cooling rack (151), the draw rod (144), the heat generating electrical component (102), the rotatable latch (106), the heat spreader (150), and the latch retention component (130).

In the example of FIG. 5, however, the rotatable latch (106) is in the engaged position. When the rotatable latch (106) is in the engaged position, the hook (192) of the rotatable latch (106) engages the pin (160) of the draw rod (144), coupling the heat generating electrical component (102) to the cooling electrical component (142). Also, when the rotatable latch (106) is in the engaged position, there is no gap (194) between the heat spreader (150) of the heat generating electrical component (102) and the cooling rack (151) of the cooling electrical component (142). When the rotatable latch (106) is in the engaged position and not in the locked state, the pin (190) of the rotatable latch (106) is not engaging the latch retention component (130).

Figure 6:
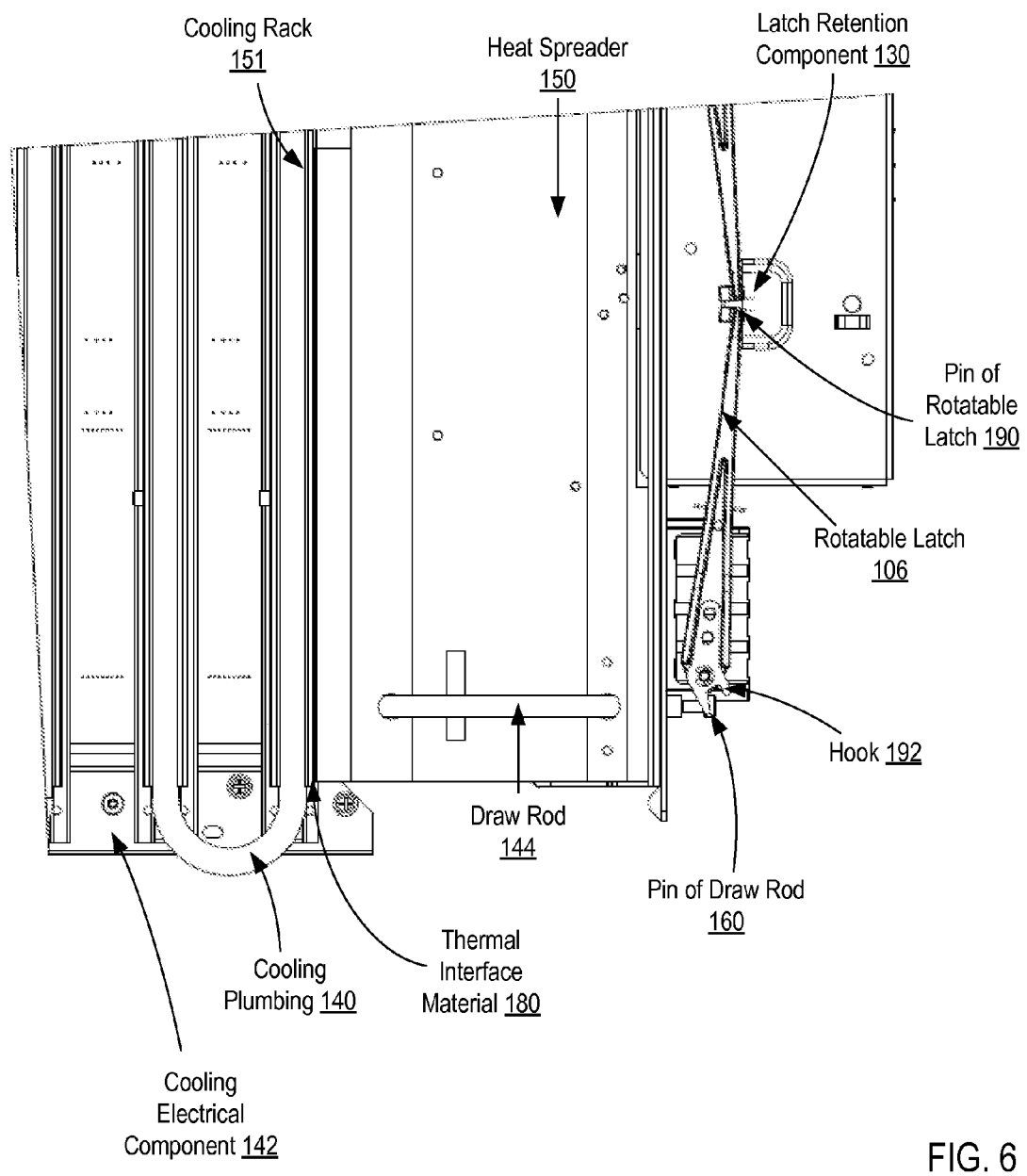
FIG. 6 sets forth a diagram of another example of an apparatus that includes a rotatable latch for compressing thermal interface material between a heat generating electrical component and a cooling electrical component in accordance with the present invention.

For further explanation, FIG. 6 sets forth a diagram of another example of an apparatus that includes a rotatable latch (106) for compressing thermal interface material (180) between a heat generating electrical component (102) and a cooling electrical component (142) in accordance with the present invention. The apparatus of FIG. 6 includes the following elements of the apparatus of FIG. 1: the cooling electrical component (142), the cooling plumbing (140), the cooling rack (151), the draw rod (144), the heat generating electrical component (102), the rotatable latch (106), the heat spreader (150), and the latch retention component (130).

In the example of FIG. 6, however, the rotatable latch (106) is in the locked state. When the rotatable latch (106) is in the locked state, the hook (192) of the rotatable latch (106) engages the pin (160) of the draw rod (144), coupling the heat generating electrical component (102) to the cooling electrical component (142) and the pin (190) of the rotatable latch (106) engages the latch retention component (130). When the rotatable latch (106) is in the locked state, the thermal interface material (180) is compressed between the heat spreader (150) of the heat generating electrical component (102) and the cooling rack (151) of the cooling electrical component (142). The rotatable latch (106) may elastically deflect in order for the latch retention component (130) to engage with the pin (190) of the rotatable latch (106).

Figure 7:
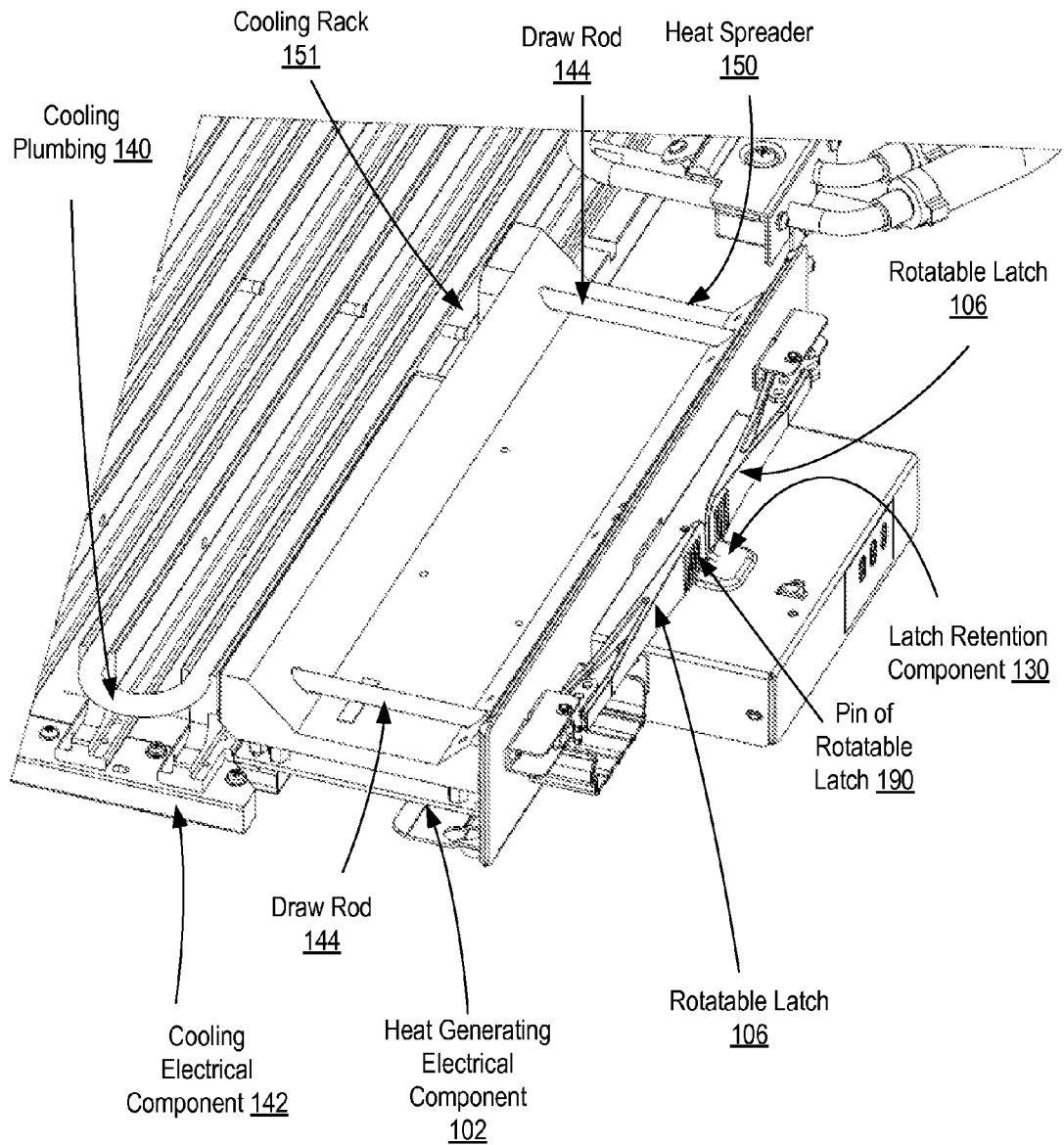
FIG. 7 sets forth a diagram of an alternative view of the apparatus of FIG. 6 that includes a rotatable latch for compressing thermal interface material between a heat generating electrical component and a cooling electrical component in accordance with the present invention.

For further explanation, FIG. 7 sets forth a diagram of an alternative view of the apparatus of FIG. 6 that includes a rotatable latch (106) for compressing thermal interface material (180) between a heat generating electrical component (102) and a cooling electrical component (142) in accordance with the present invention. The apparatus of FIG. 7 includes the following elements of the apparatus of FIG. 6: the cooling electrical component (142), the cooling plumbing (140), the cooling rack (151), the draw rod (144), the heat generating electrical component (102), the rotatable latch (106), the heat spreader (150), and the latch retention component (130). The latch retention component (130) may be configured to act as a stopping point that prevents the rotatable latch (106) from rotating from the locked state to either the engaged position or the unengaged position. To disengage the latch retention component (130), a user may press the latch retention component (130) which enables the pin (190) of the rotatable latch (106) to rotate into the engaged position.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for compression of a thermal interface material between a heat generating electrical component and a cooling electrical component, the apparatus comprising:
    a draw rod coupled at one end to the cooling electrical component, the draw rod passing through the heat generating electrical component; wherein the draw rod includes a pin on the end opposite the end coupled to the cooling electrical component; and
    a rotatable latch coupled to the heat generating electrical component, the rotatable latch including a hook at one end; wherein when the rotatable latch is in an engaged position, the hook of the rotatable latch engages the pin of the draw rod such that the thermal interface material adhered to the heat generating component is coupled to the cooling electrical component; wherein when the rotatable latch is in an unengaged position, the hook of the rotatable latch is not engaged with the pin of the draw rod.

2. The apparatus of claim 1, wherein rotating the rotatable latch moves the rotatable latch from the unengaged position to the engaged position.

3. The apparatus of claim 1, wherein rotating the rotatable latch from the engaged position to a locked state brings the cooling electrical component closer to the heat generating electrical component such that the thermal interface material is compressed.

4. The apparatus of claim 3 further comprising a latch retention component that holds the rotatable latch in the locked state.

5. The apparatus of claim 4, wherein the rotatable latch includes a pin at the end opposite the end with the hook; wherein when the rotatable latch is in the locked state, the pin of the rotatable latch engages the latch retention component.

6. The apparatus of claim 5, wherein the rotatable latch elastically deflects in order for the latch retention component to engage with the pin of the rotatable latch.

7. The apparatus of claim 1, wherein the heat generating electrical component is removable from the cooling electrical component when the rotatable latch is in the unengaged position.

8. The apparatus of claim 1, wherein the rotatable latch serves as a handle to remove the heat generating electrical component from the cooling electrical component; wherein the rotatable latch provides mechanical advantage for both the docking and undocking of the heat generating electrical component.

9. The apparatus of claim 1, wherein the heat generating electrical component includes a power supply card with a heat spreader.

10. The apparatus of claim 1, further comprising a pivot plate that resolves a force of the rotatable latch on the heat generating electrical component and the cooling electrical component.

11. A heat dissipation apparatus, the heat dissipation apparatus comprising:
    a heat generating electrical component, wherein a thermal interface material is adhered to the bottom of the heat generating electrical component;
    a cooling electrical component;
    a draw rod coupled at one end to the cooling electrical component, the draw rod passing through the heat generating electrical component; wherein the draw rod includes a pin on the end opposite the end coupled to the cooling electrical component; and a rotatable latch coupled to the heat generating electrical component, the rotatable latch including a hook at one end; wherein when the rotatable latch is in an engaged position, the hook of the rotatable latch engages the pin of the draw rod such that the thermal interface material adhered to the heat generating component is coupled to the cooling electrical component; wherein when the rotatable latch is in an unengaged position, the hook of the rotatable latch is not engaged with the pin of the draw rod.

12. The heat dissipation apparatus of claim 11, wherein rotating the rotatable latch moves the rotatable latch from the unengaged position to the engaged position.

13. The heat dissipation apparatus of claim 11, wherein rotating the rotatable latch from the engaged position to a locked state brings the cooling electrical component closer to the heat generating electrical component such that the thermal interface material is compressed.

14. The heat dissipation apparatus of claim 13 further comprising a latch retention component that holds the rotatable latch in the locked state.

15. The heat dissipation apparatus of claim 14, wherein the rotatable latch includes a pin at the end opposite the end with the hook; wherein when the rotatable latch is in the locked state, the pin of the rotatable latch engages the latch retention component.

16. The heat dissipation apparatus of claim 15, wherein the rotatable latch elastically deflects in order for the latch retention component to engage with the pin of the rotatable latch.

17. The heat dissipation apparatus of claim 11, wherein the heat generating electrical component is removable from the cooling electrical component when the rotatable latch is in the unengaged position.

18. The heat dissipation apparatus of claim 11, wherein the rotatable latch serves as a handle to remove the heat generating electrical component from the cooling electrical component; wherein the rotatable latch provides mechanical advantage for both the docking and undocking of the heat generating electrical component.

19. The heat dissipation apparatus of claim 11, wherein the heat generating electrical component includes a power supply card with a heat spreader.

20. The heat dissipation apparatus of claim 12 further comprising a pivot plate that resolves a force of the rotatable latch on the heat generating electrical component and the cooling electrical component.

\* \* \* \* \*